United States Patent
Lee et al.

(10) Patent No.: US 11,776,162 B2
(45) Date of Patent: Oct. 3, 2023

(54) CIRCUIT BREAKER OPENING/CLOSING ASSISTANCE APPARATUS

(71) Applicant: LS ELECTRIC CO., LTD., Anyang-si (KR)

(72) Inventors: Min-Je Lee, Anyang-si (KR); Bum-Youl Kim, Anyang-si (KR)

(73) Assignee: LS ELECTRIC CO., LTD., Anyang-si (KR)

(*) Notice: Subject to any disclaimer, the term of this patent is extended or adjusted under 35 U.S.C. 154(b) by 662 days.

(21) Appl. No.: 16/971,573

(22) PCT Filed: Jan. 21, 2019

(86) PCT No.: PCT/KR2019/000858
§ 371 (c)(1),
(2) Date: Aug. 20, 2020

(87) PCT Pub. No.: WO2019/177258
PCT Pub. Date: Sep. 19, 2019

(65) Prior Publication Data
US 2020/0388027 A1    Dec. 10, 2020

(30) Foreign Application Priority Data

Mar. 14, 2018  (KR) .......... 10-2018-0029586
Mar. 14, 2018  (KR) .......... 10-2018-0029587

(51) Int. Cl.
*G01K 1/02*    (2021.01)
*G01R 31/327*   (2006.01)
(Continued)

(52) U.S. Cl.
CPC ................... *G06T 7/90* (2017.01); *G01J 5/00* (2013.01); *G01K 1/026* (2013.01); *G01K 7/22* (2013.01);
(Continued)

(58) Field of Classification Search
CPC ........ G01J 5/00; G01J 5/80; G01J 2005/0077; G01K 1/02; G01K 1/026; G01K 7/22;
(Continued)

(56) References Cited

U.S. PATENT DOCUMENTS 7,193,827 B2    3/2007  Reid et al.
7,994,444 B2    8/2011  Olszewski et al.
(Continued)

FOREIGN PATENT DOCUMENTS

CN    1973414 A    5/2007
CN    101036209 A    9/2007
(Continued)

OTHER PUBLICATIONS

Chinese Office Action for related Chinese Application No. 201980018148.9; action dated Apr. 7, 2022; (5 pages).
(Continued)

*Primary Examiner* — Levi Gannon
(74) *Attorney, Agent, or Firm* — K&L Gates LLP

(57) ABSTRACT

The present disclosure relates to a circuit breaker opening/closing assistance apparatus for correcting a thermal image of a circuit breaker on the basis of a visible image of the circuit breaker, and assisting an opening/closing operation of the relevant circuit breaker on the basis of a temperature identified through the corrected thermal image. Further, the present disclosure relates to a circuit breaker opening/closing assistance apparatus for identifying a temperature of a circuit breaker in which a failure has occurred, on the basis of a thermal image of the circuit breaker, and assisting an opening/closing operation of the relevant circuit breaker on the basis of the identified temperature.

20 Claims, 15 Drawing Sheets

(51) Int. Cl.
| | | |
|---|---|---|
| *G06T 7/90* | (2017.01) | |
| *H01H 71/04* | (2006.01) | |
| *H01H 73/00* | (2006.01) | |
| *G01J 5/00* | (2022.01) | |
| *G01K 7/22* | (2006.01) | |
| *G06T 7/00* | (2017.01) | |
| *G06V 10/141* | (2022.01) | |
| *G06V 10/56* | (2022.01) | |
| *G01J 5/80* | (2022.01) | |
| *H01H 11/00* | (2006.01) | |

(52) U.S. Cl.
CPC ........ *G01R 31/3275* (2013.01); *G06T 7/0008* (2013.01); *G06V 10/141* (2022.01); *G06V 10/56* (2022.01); *H01H 71/04* (2013.01); *H01H 73/00* (2013.01); *G01J 5/80* (2022.01); *G01J 2005/0077* (2013.01); *G06T 2207/10024* (2013.01); *G06T 2207/30108* (2013.01); *H01H 2011/0068* (2013.01)

(58) Field of Classification Search
CPC .... G01R 31/327; G01R 31/3275; G06T 5/00; G06T 7/0008; G06T 7/90; G06T 2207/10024; G06T 2207/30108; G06V 10/141; G06V 10/56; H01H 71/04; H01H 71/74; H01H 73/00; H01H 2011/0068; H02J 13/00; H02J 13/00002; H02J 13/00004; H02J 13/00036; H02J 13/0004
See application file for complete search history.

(56) References Cited

U.S. PATENT DOCUMENTS

| | | | |
|---|---|---|---|
| 8,885,313 | B2 | 11/2014 | Zhou |
| 9,202,647 | B2 | 12/2015 | Saito et al. |
| 9,488,714 | B2 | 11/2016 | Dougherty |
| 2005/0083616 | A1 | 4/2005 | Reid et al. |
| 2008/0105524 | A1 | 5/2008 | Olszewski et al. |
| 2010/0110600 | A1 | 5/2010 | Saito et al. |
| 2012/0050937 | A1 | 3/2012 | Saito et al. |
| 2014/0078633 | A1 | 3/2014 | Zhou |
| 2014/0267353 | A1* | 9/2014 | Schmidt ............... H04N 23/631 345/589 |
| 2014/0278179 | A1 | 9/2014 | Dougherty |

FOREIGN PATENT DOCUMENTS

| | | | |
|---|---|---|---|
| CN | 101373684 | A | 2/2009 |
| CN | 101728870 | A | 6/2010 |
| CN | 102064052 | A | 5/2011 |
| CN | 104049227 | A | 9/2014 |
| CN | 104641442 | A | 5/2015 |
| CN | 106876218 | A | 6/2017 |
| JP | 2003223839 | A | 8/2003 |
| JP | 2006177726 | A | 7/2006 |
| KR | 20040065447 | A | 7/2004 |
| KR | 20130122509 | A | 11/2013 |
| KR | 101708222 | B1 | 2/2017 |
| KR | 20170047979 | A | 5/2017 |
| KR | 101787528 | B1 | 10/2017 |

OTHER PUBLICATIONS

Chinese Office Action for related Chinese Application No. 201980018148.9; action dated Sep. 5, 2022; (7 pages).
International Search Report for related International No. PCT/KR2019/000858; action dated Sep. 19, 2019; (5 pages).
Written Opinion for related International No. PCT/KR2019/000858; action dated Sep. 19, 2019; (5 pages).

* cited by examiner

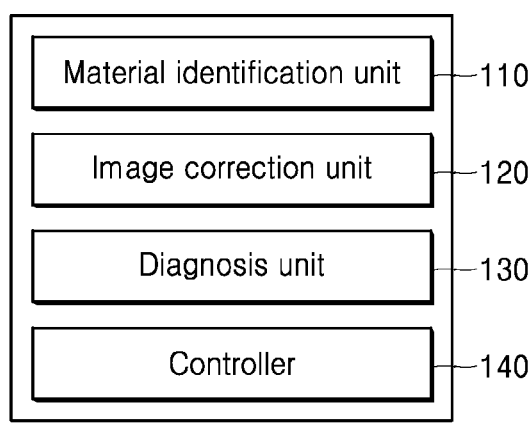
[FIG. 1]

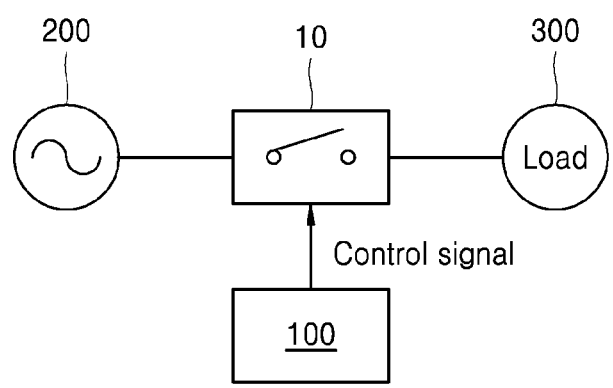
[FIG. 2]

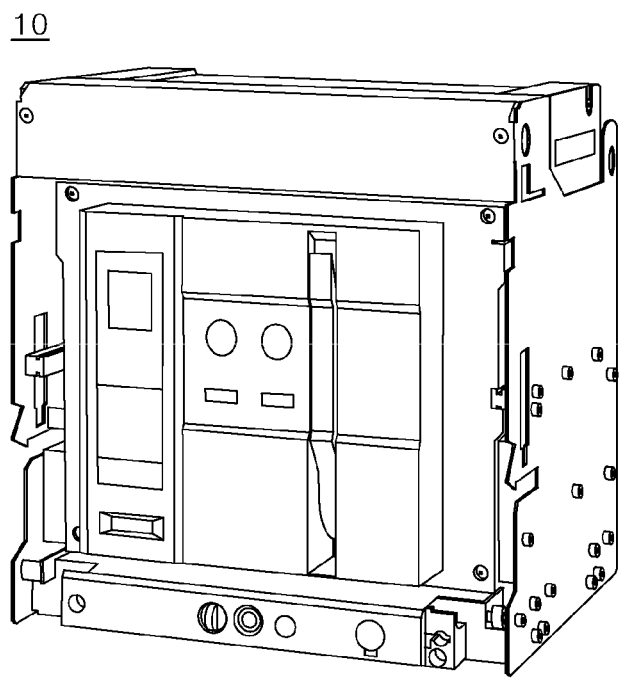
[FIG. 3]

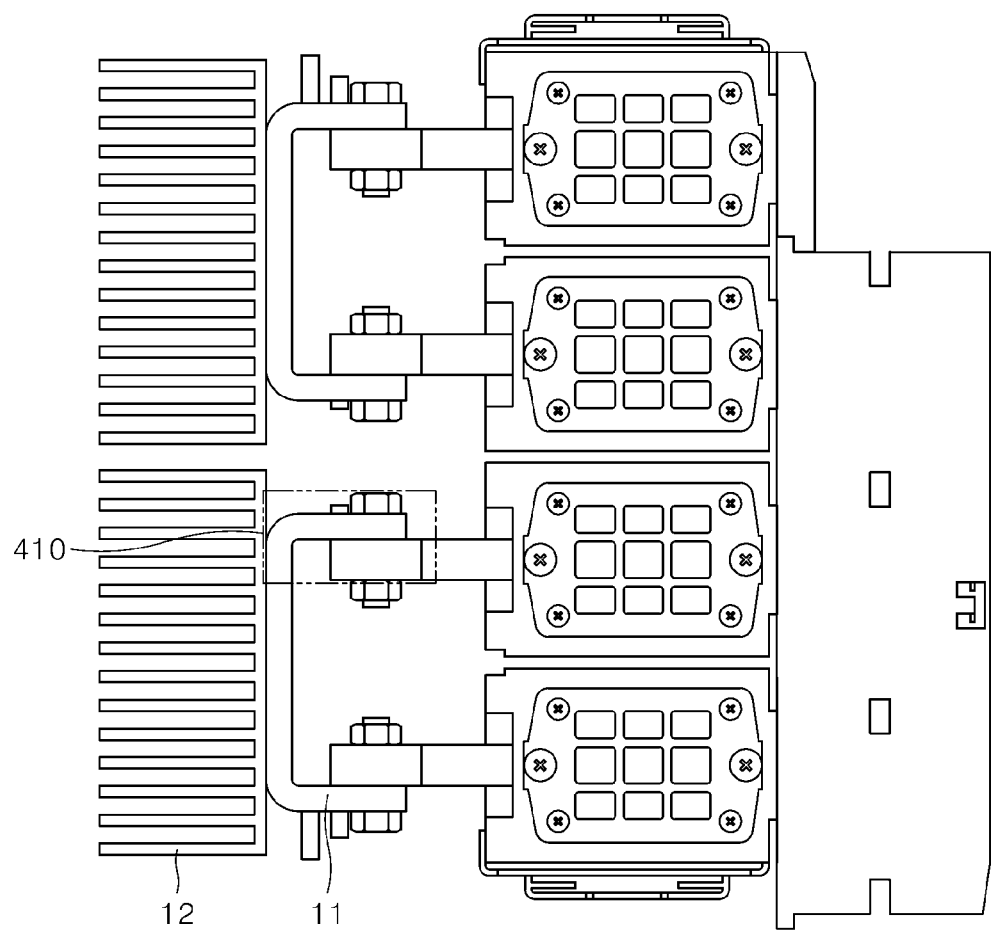
[FIG. 4]

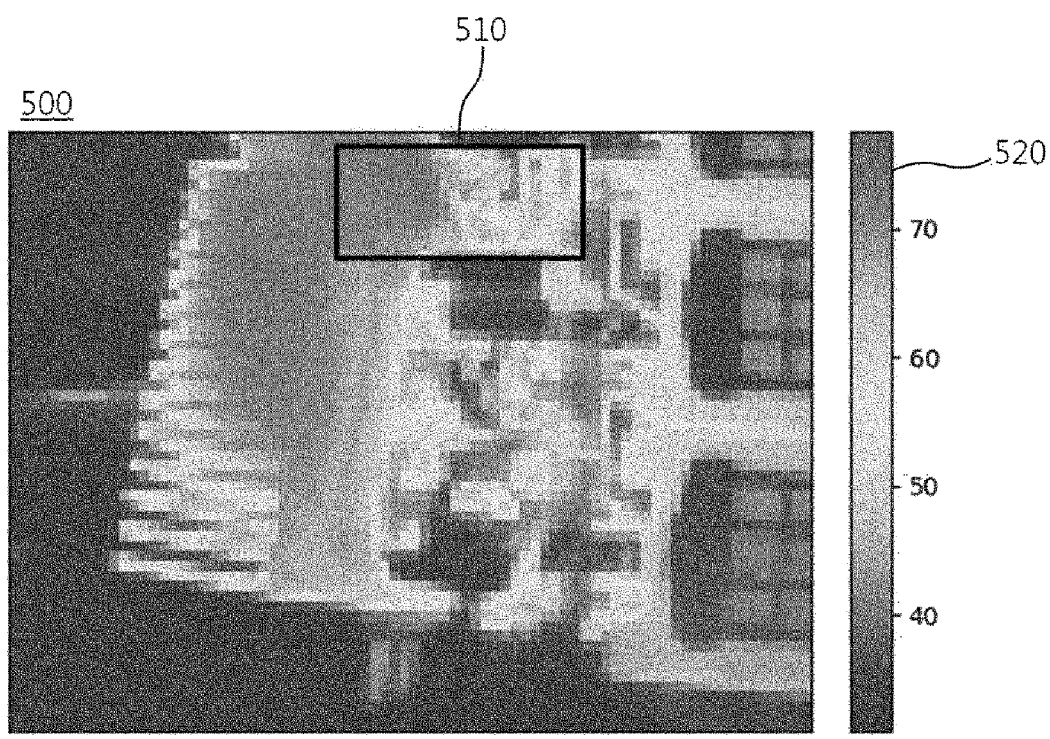
[FIG. 5]

400

| | | | |
|---|---|---|---|
| ⋮ ⋯ | | | ⋮ ⋯ |
| | RGB1 (X1,Y1) | RGB2 (X2,Y2) | |
| | RGB3 (X3,Y3) | RGB4 (X4,Y4) | |
| ⋯ ⋮ | | | ⋮ ⋯ |

【FIG. 6】

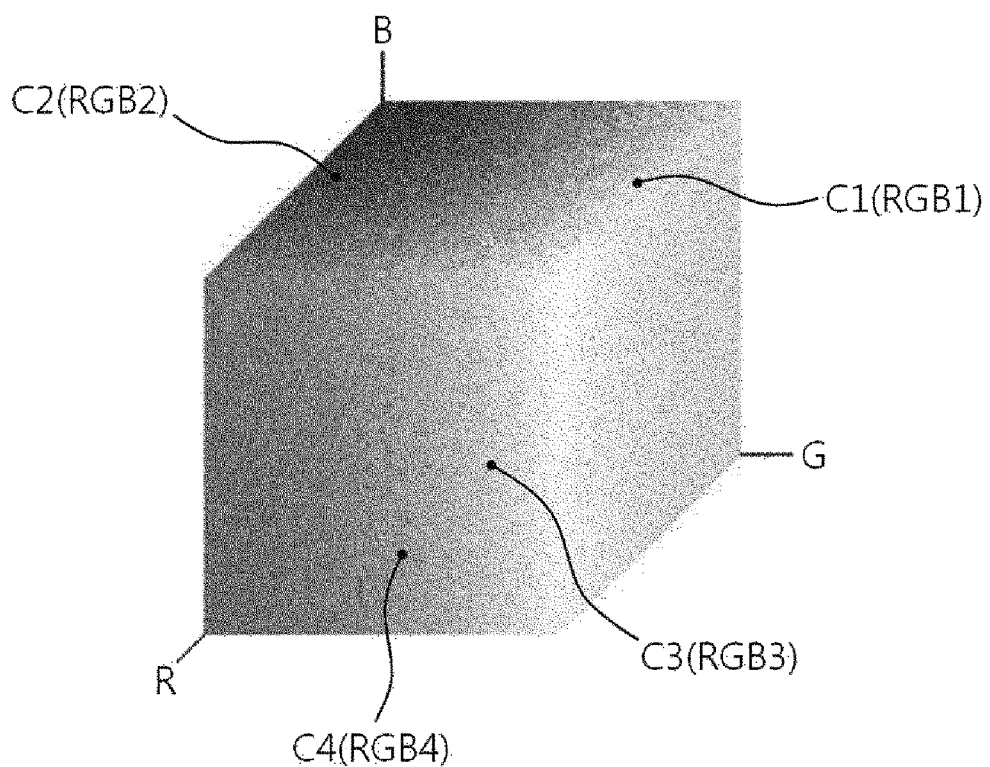
[FIG. 7]

500

| | e1<br>(X1,Y1) | e2<br>(X2,Y2) | |
| | e3<br>(X3,Y3) | e4<br>(X4,Y4) | |

[FIG. 8]

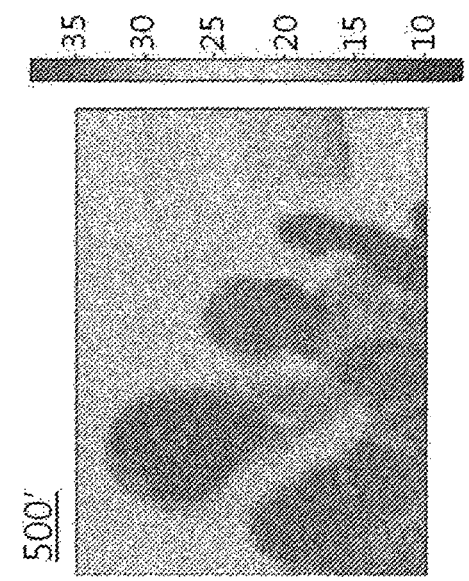
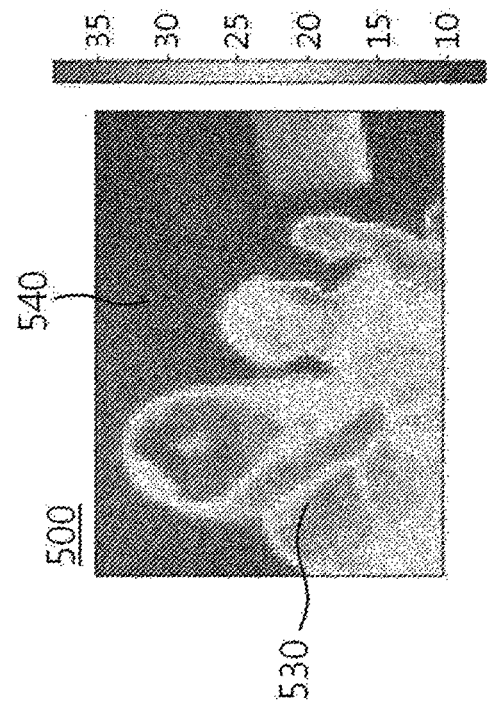
[FIG. 9]

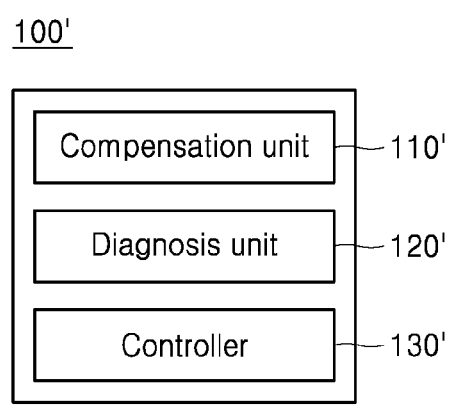
[FIG. 10]

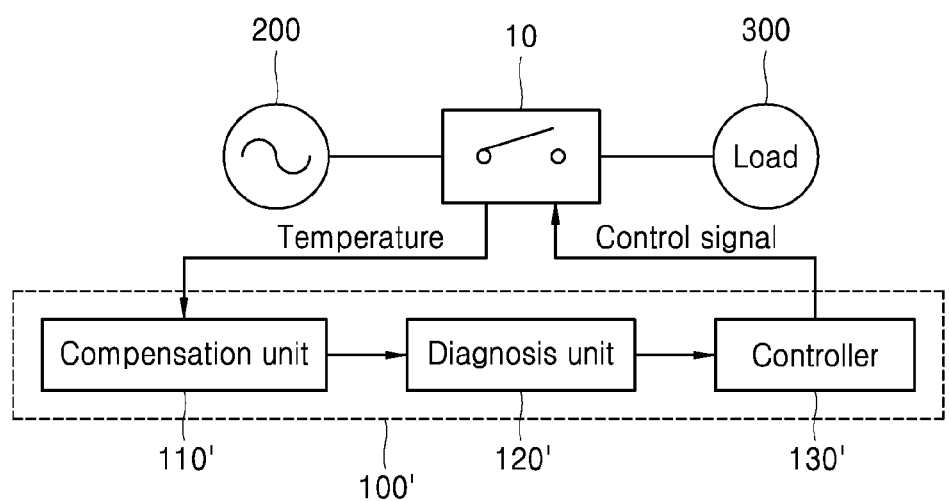
[FIG. 11]

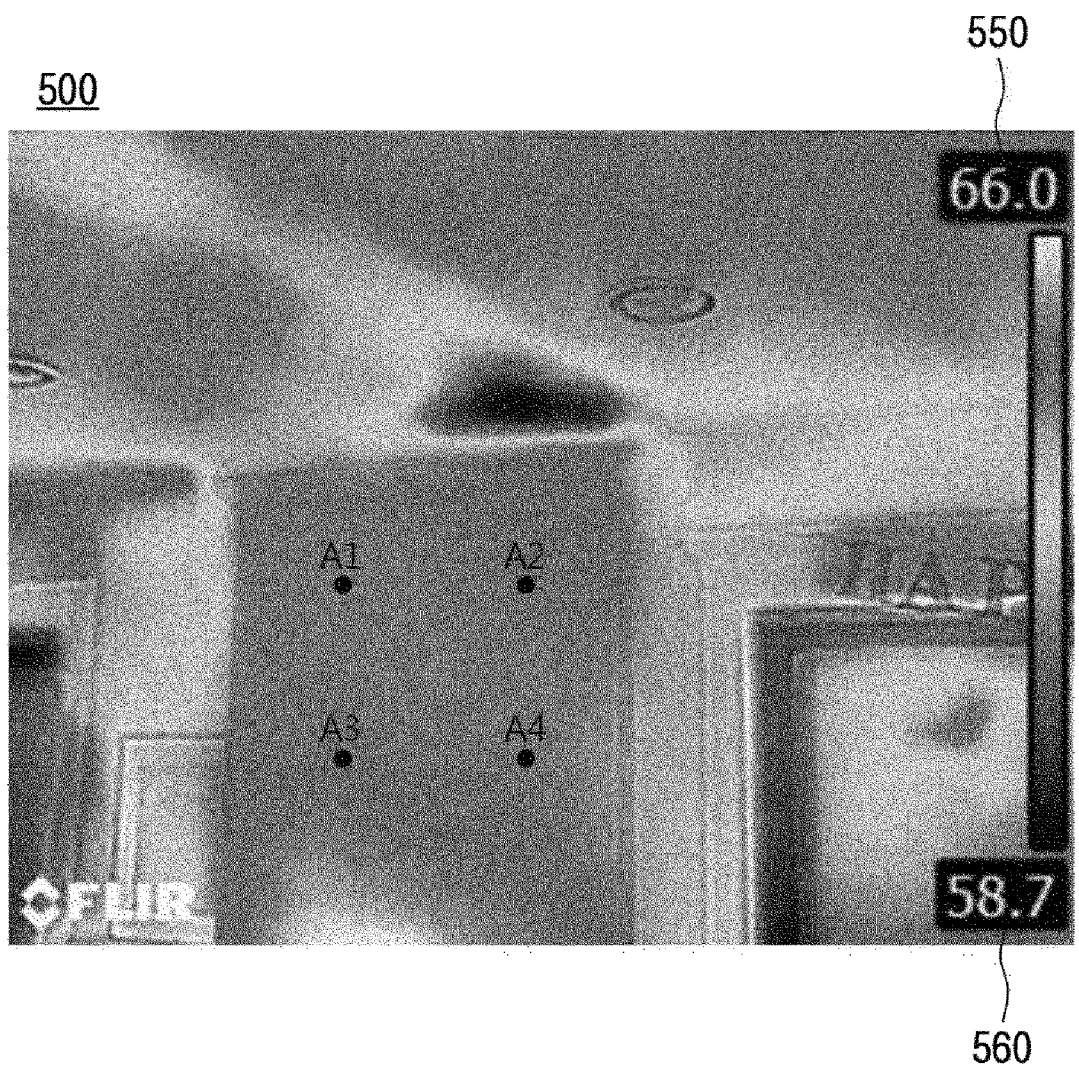
[FIG. 12]

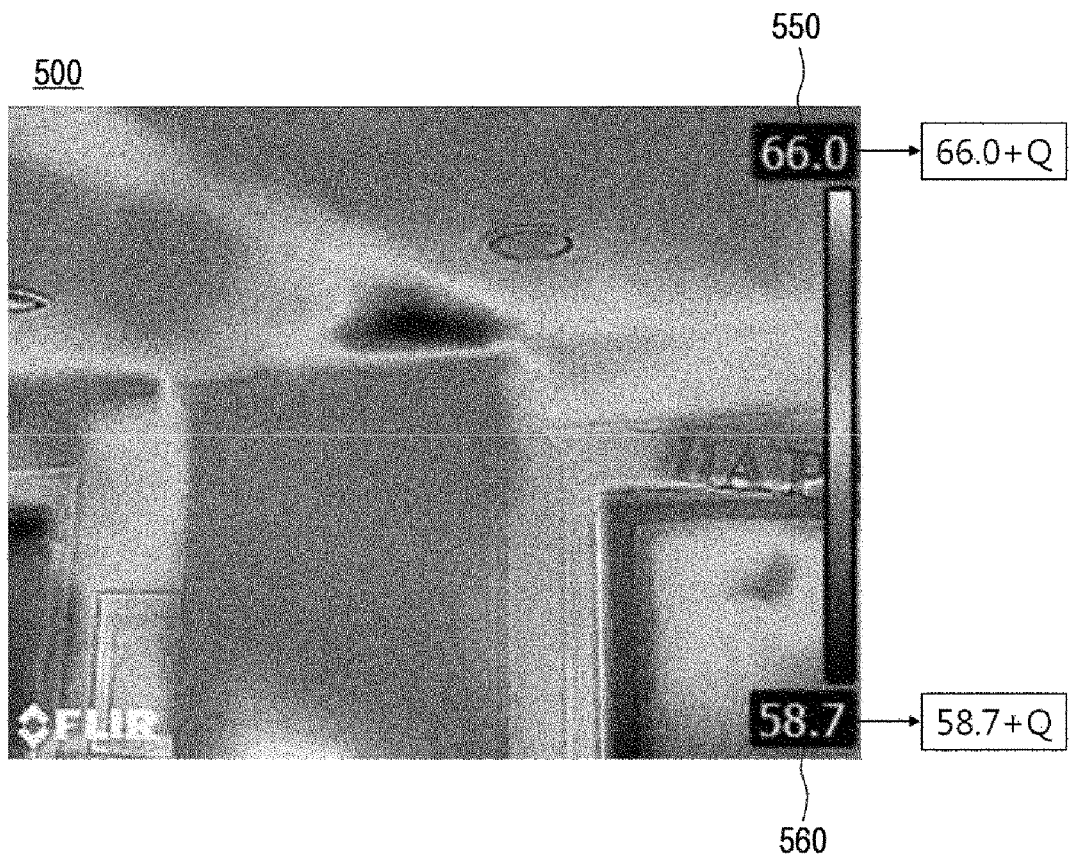
【FIG. 13】

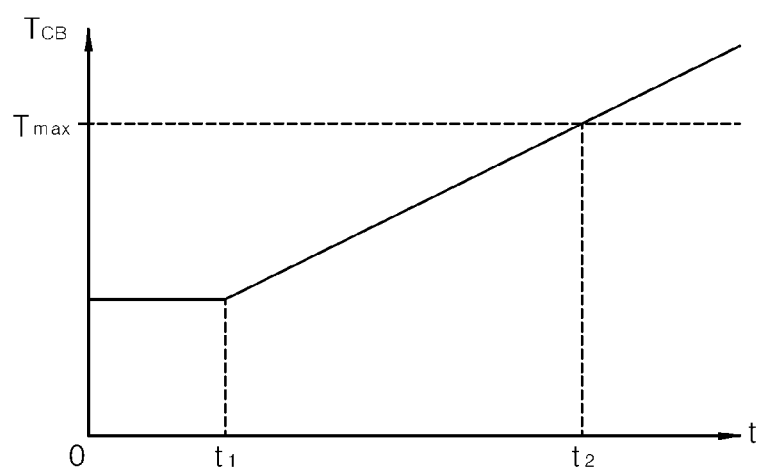
[FIG. 14]

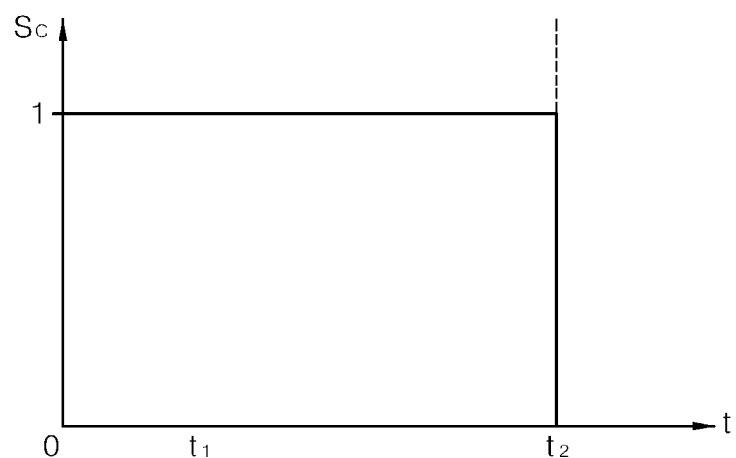
[FIG. 15]

CIRCUIT BREAKER OPENING/CLOSING ASSISTANCE APPARATUS

CROSS-REFERENCE TO RELATED APPLICATIONS

The present application is a National Stage of International Application No. PCT/KR2019/000858, filed on Jan. 21, 2019, which claims the benefit of earlier filing date and right of priority to Korean Application No. 10-2018-0029586 filed on Mar. 14, 2018, and Korean Application No. 10-2018-0029587 filed on Mar. 14, 2018, the contents of which are all hereby incorporated by reference herein in their entirety.

FIELD

The present disclosure relates to a circuit breaker opening/closing assistance device that identifies a temperature of the circuit breaker, and assists opening/closing operations of the circuit breaker, based on the identified temperature.

BACKGROUND

A circuit breaker (CB) is connected to and disposed between a power system supplying power and a load receiving the power from the power system. When overcurrent flows in the load, the CB detects the overcurrent and prevents the power supply to the load.

The circuit breaker includes a relay that selectively opens and closes a circuit. The relay may include, for example, OCR (Over Current Relay) operating via a mechanical contact, and EOCR (Electronic Over Current Relay) operating in a semiconductor contactless manner.

The circuit breaker may provide a control signal to an internal relay based on an amount of current flowing via the load to selectively open and close the circuit.

In this connection, when the control signal is not provided to the relay in a specific control period or an incorrect control signal is provided to the relay, an closed/opened state of the relay is incorrect so that overcurrent flows in the load or power supplied to the load is cut off.

Although current overcurrent and instantaneous power shutdown may adversely affect the load and other power systems connected to the load, the user may incorrectly trust an operating state of the circuit breaker and thus may incorrectly interpret states of the load and the power system.

BRIEF SUMMARY

A purpose of the present disclosure is to provide a circuit breaker opening/closing assistance device that corrects a thermal image of the circuit breaker based on an emissivity of a material constituting the circuit breaker to improve accuracy of temperature measurement via the thermal image.

Further, a purpose of the present disclosure to provide a circuit breaker opening/closing assistance device that determines an emissivity of a material imaged on a visible image based on a color change of the visible image to reflect a surface state of the material in correcting a thermal image.

Further, a purpose of the present disclosure is to provide a circuit breaker opening/closing assistance device which compares a current closed/opened state of the circuit breaker with a normal closed/opened state of the circuit breaker as identified based on a thermal image of the circuit breaker to determine absence or presence of failure of the circuit breaker.

Further, a purpose of the present disclosure is to provide a circuit breaker opening/closing assistance device that assists opening/closing operation of the circuit breaker based on a temperature detected based on a thermal image of the circuit breaker to prevent overcurrent occurrence and power supply interruption due to malfunction of the circuit breaker.

Further, a purpose of the present disclosure is to provide a circuit breaker opening/closing assistance device that compensates for a temperature value detected based on a thermal image of the circuit breaker to improve accuracy of temperature measurement via the thermal image.

Further, a purpose of the present disclosure is to provide a circuit breaker opening/closing assistance device which compares a current closed/opened state of the circuit breaker with a normal closed/opened state of the circuit breaker as identified based on a thermal image of the circuit breaker to determine absence or presence of failure of the circuit breaker.

Further, a purpose of the present disclosure is to provide a circuit breaker opening/closing assistance device that assists opening/closing operation of the circuit breaker based on a temperature detected based on a thermal image of the circuit breaker to prevent overcurrent occurrence and power supply interruption due to malfunction of the circuit breaker.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In one aspect of the present disclosure, there is provided a device for assisting opening and closing of a circuit breaker connected to and disposed between a power system and a load, the device comprising: a material identification unit configured to acquire a visible image of the circuit breaker using a light source, and identify a material imaged on the acquired visible image; an image correction unit configured to acquire a thermal image of the circuit breaker, and correct the thermal image based on emissivity of the identified material; a diagnosis unit configured to: identify a normal operation state of the circuit breaker based on a temperature value detected on the corrected thermal image; and compare the identified normal operation state with a current operation state of the circuit breaker and diagnose absence or presence of failure of the circuit breaker based on the comparison result; and a controller configured to generate a control signal based on the absence or presence of the failure of the circuit breaker, and provide the generated control signal to the circuit breaker.

In another aspect of the present disclosure, there is provided a device for assisting opening and closing of a circuit breaker having a plurality of temperature sensors disposed thereon, the device comprising: a compensation unit configured to compensate for a temperature value of a thermal image of the circuit breaker, based on a first temperature detected on the thermal image of the circuit breaker and a second temperature provided from each of the plurality of temperature sensors; a diagnosis unit configured to: identify a normal operation state of the circuit breaker based on a temperature value detected on the compensated thermal image; and compare the identified normal operation state with a current operation state of the circuit breaker and diagnose absence or presence of failure of the circuit breaker, based on the comparison result; and a controller configured to generate a control signal based on the absence or presence of the failure of the circuit breaker, and provide the generated control signal to the circuit breaker.

According to the present disclosure as described above, correcting the thermal image of the circuit breaker based on the emissivity of the material constituting the circuit breaker may allow an effect of improving the accuracy of temperature measurement via the thermal image.

Further, according to the present disclosure, determining the emissivity of the material imaged on the visible image based on the color change of the visible image may allow an effect of reflecting the surface state of the material in correcting the thermal image.

Further, according to the present disclosure, comparing the normal closed/opened state as identified based on the thermal image of the circuit breaker with the current closed/opened state of the circuit breaker may allow an effect of grasping the absence or presence of the failure of the circuit breaker.

Further, according to the present disclosure, assisting the opening/closing operation of the circuit breaker based on the temperature detected via the thermal image of the circuit breaker may allow an effect of preventing overcurrent occurrence and power supply interruption due to malfunction of the circuit breaker.

Further, according to the present disclosure, compensating the temperature value detected via the thermal image of the circuit breaker may allow an effect of improving the accuracy of temperature measurement via the thermal image.

Further, according to the present disclosure, comparing the normal closed/opened state as identified based on the thermal image of the circuit breaker with the current closed/opened state of the circuit breaker may allow an effect of identifying the absence or presence of failure of the circuit breaker.

Further, according to the present disclosure, assisting the opening/closing operation of the circuit breaker based on the temperature detected via the thermal image of the circuit breaker may allow an effect of preventing overcurrent occurrence and power supply interruption due to malfunction of the circuit breaker.

BRIEF DESCRIPTION OF THE DRAWINGS

FIG. 1 shows a circuit breaker opening/closing assistance device according to an embodiment of the present disclosure.

FIG. 2 is a diagram illustrating a manner in which the circuit breaker opening/closing assistance device according to an embodiment of the present disclosure controls a circuit breaker connected to and disposed between a power system and a load.

FIG. 3 is a diagram showing an example of the circuit breaker shown in FIG. 2.

FIG. 4 shows an example of a visible image of the circuit breaker.

FIG. 5 shows an example of a thermal image of the circuit breaker.

FIG. 6 shows color data detected at arbitrary coordinates of the visible image.

FIG. 7 shows a color space for RGB data.

FIG. 8 shows emissivity at arbitrary coordinates of the thermal image.

FIG. 9 shows a thermal image corrected based on emissivity.

FIG. 10 shows a circuit breaker opening/closing assistance device according to another embodiment of the present disclosure.

FIG. 11 is a diagram illustrating a manner in which the circuit breaker opening/closing assistance device according to another embodiment of the present disclosure controls a circuit breaker connected to and disposed between a power system and a load.

FIG. 12 is a diagram showing a thermal image obtained by imaging a plurality of measurement points set in the circuit breaker.

FIG. 13 is a view illustrating a manner in which a temperature reference value of the thermal image shown in FIG. 12 is adjusted based on a compensation value.

FIG. 14 and FIG. 15 are graphs respectively showing a temperature value of the thermal image and a control signal generated based on the temperature value.

DETAILED DESCRIPTION

The above-described purposes, features and advantages will be described in detail below with reference to the accompanying drawings. Accordingly, a person with ordinary skill in a technical field to which the present disclosure belongs may easily implement an technical idea of the present disclosure. In describing the present disclosure, when it is determined that a specific description of a known element related to the present disclosure may unnecessarily obscure a gist of the present disclosure, detailed descriptions thereof may be omitted. Hereinafter, preferred embodiments of the present disclosure will be described in detail with reference to the accompanying drawings. In the drawings, the same reference numerals are used to indicate the same or similar components.

The present disclosure relates to a circuit breaker opening/closing assistance device that identifies a temperature of the circuit breaker, and assists opening/closing operation of the circuit breaker based on the identified temperature.

More specifically, in one embodiment, the present disclosure relates to a device which corrects a thermal image of the circuit breaker based on a visible image of the circuit breaker, and assists opening/closing operation of the circuit breaker, based on a temperature identified via the corrected thermal image.

Further, in another embodiment, the present disclosure relates to a circuit breaker opening/closing assistance device that identifies a temperature of the circuit breaker based on a thermal image of the circuit breaker where failure has occurred, and assists opening/closing operation of the circuit breaker based on the identified temperature.

A circuit breaker (CB) is connected to and disposed between a power system supplying power and a load receiving the power from the power system. When overcurrent flows in the load, the CB detects the overcurrent and prevents the power supply to the load.

The circuit breaker includes a relay that selectively opens and closes a circuit. The relay may include, for example, OCR (Over Current Relay) operating via a mechanical contact, and EOCR (Electronic Over Current Relay) operating in a semiconductor contactless manner.

A circuit breaker opening/closing assistance device as described later may be connected to the circuit breaker as described above to diagnose absence or presence of failure of the circuit breaker, and to assist the circuit breaker in event of failure of the circuit breaker.

Figure 8:
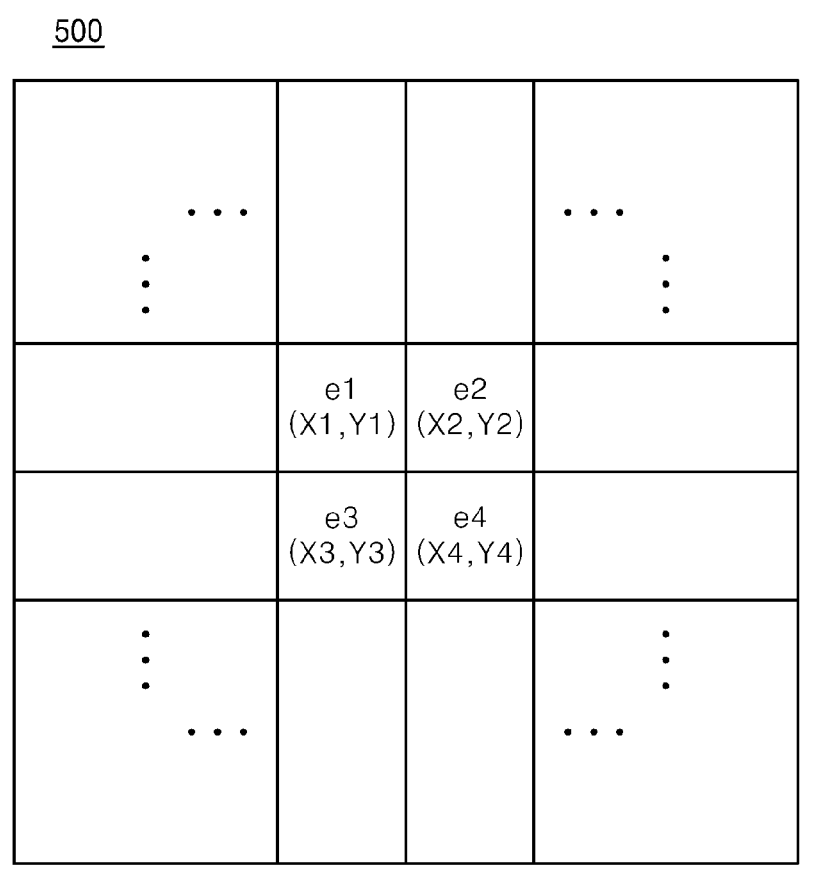

Hereinafter, a circuit breaker opening/closing assistance device according to an embodiment of the present disclosure will be described in detail with reference to FIG. 1 to FIG. 9.

FIG. 1 is a diagram showing a circuit breaker opening/closing assistance device according to an embodiment of the present disclosure. FIG. 2 is a diagram illustrating a manner in which the circuit breaker opening/closing assistance device according to an embodiment of the present disclosure controls a circuit breaker connected to and disposed between a power system and a load.

FIG. 3 is a diagram showing an example of the circuit breaker shown in FIG. 2.

FIG. 4 shows an example of a visible image of the circuit breaker. FIG. 5 shows an example of a thermal image of the circuit breaker.

FIG. 6 shows color data detected at arbitrary coordinates of the visible image. FIG. 7 shows a color space for RGB data. FIG. 8 shows emissivity at arbitrary coordinates of the thermal image.

FIG. 9 shows a thermal image corrected based on emissivity.

Referring to FIG. 1, a circuit breaker opening/closing assistance device 100 according to an embodiment of the present disclosure may include a material identification unit 110, an image correction unit 120, a diagnosis unit 130, and a controller 140. The circuit breaker opening/closing assistance device 100 shown in FIG. 1 is exemplary. The components thereof are not limited to the embodiment shown in FIG. 1. Some components may be added, changed, or deleted as necessary.

Each of the components constituting the circuit breaker opening/closing assistance device 100 may include a processor and a memory and may perform each function as described below via operation of the processor using the memory. Alternatively, the components may perform the functions as described below using one main processor.

Referring to FIG. 2, the circuit breaker opening/closing assistance device 100 may be connected to the circuit breaker 10 disposed between and connected to a power system 200 and a load 300. In FIG. 2, the circuit breaker 10 is briefly illustrated. However, as described above, the circuit breaker 10 may be embodied as various types thereof for selectively opening and closing a circuit between the power system 200 and the load 300.

For example, the circuit breaker 10 may be an air circuit breaker (ACB) that performs cut-off operation via an arc extinguishing scheme using air as an insulating material.

FIG. 3 is an example of the circuit breaker 10, and is a view showing the air circuit breaker. Referring to FIG. 3, the circuit breaker 10 may have an internal circuit (not shown) for performing a cut-off operation, which is mounted in a casing equipped with an external interface.

The user may supply power to the circuit breaker 10 or stop the power supply thereto via the external interface and may monitor an operation status of the circuit breaker 10 via the external interface and may control magnitude of current to be blocked via the external interface.

The material identification unit 110 may acquire a visible image 400 of the circuit breaker 10 using a light source.

The material identification unit 110 may receive the visible image 400 from a camera (not shown) installed inside or outside the circuit breaker opening/closing assistance device 100 via data communication with the camera. In this connection, the camera may sense light reflected from the circuit breaker 10. The camera may be a digital camera capable of data communication.

The material identification unit 110 may control on/off, intensity of illumination, and irradiation angle of the light source. In this connection, the camera may detect light as generated by the light source and reflected from the circuit breaker 10 to generate the visible image 400.

The camera may be installed outside the circuit breaker 10 to detect light reflected from an outside of the circuit breaker 10 to generate the visible image 400. Alternatively, the camera may be installed inside the circuit breaker 10 to detect visible light from a component inside the circuit breaker 10 to generate the visible image 400. A position of the camera is not limited thereto. The camera may be installed at any position where the camera may detect the light as generated by the light source and reflected from the circuit breaker 10.

Referring to FIG. 4, in one example, the camera may generate the visible image 400 of a bus bar 11 and a portion adjacent to a heat dissipating plate 12 in the circuit breaker 10. The generated visible image 400 may be provided to the material identification unit 110.

The material identification unit 110 may identify a material imaged on the visible image 400.

Materials constituting the circuit breaker 10 may have different colors. Accordingly, the materials imaged on the visible image 400 may have different colors based on types of the materials.

The material identification unit 110 may identify a type of a material imaged on the visible image 400 based on a color rendered on the visible image 400.

More specifically, the material identification unit 110 may identify a type of a material imaged at each coordinate of the visible image 400 based on color data detected at each coordinate of the visible image 400.

The material identification unit 110 may detect a coordinate of any measurement point in the visible image 400, and may extract color data corresponding to the detected coordinate.

Referring to FIG. 6, the visible image 400 may be divided into a matrix having coordinates. In this connection, as shown in FIG. 6, the material identification unit 110 may define coordinates corresponding to first to fourth measurement points as (X1, Y1), (X2, Y2), (X3, Y3), and (X4, Y4).

Subsequently, the material identification unit 110 may extract color data rendered at the detected coordinates. In this connection, the color data may include RGB (Red, Green, Blue) data, HSV (Hue Saturation Value) data, CMY (Cyan, Magenta, Yellow) data, YUV data, and CMYK data. However, in following descriptions, the color data is assumed to be RGB data.

The material identification unit 110 may extract R (Red) component, G (Green) component, and B (Blue) component of a color rendered at the coordinate of the measurement point and collect the extracted components to generate the color data.

For example, the material identification unit 110 may collect R component, G component, and B component of a color expressed at the (X1, Y1) coordinate and may determine color data at the first measurement point as RGB 1.

In this way, the material identification unit 110 may collect R component, G component, and B component of each of colors rendered at the coordinates (X2, Y2), (X3, Y3), and (X4, Y4) and may determine color data at the second to fourth measurement points as RGB 2, RGB 3 and RGB 4, respectively.

In one example, FIG. 4 shows a manner in which color data only at the four coordinates are detected. However, this is for convenience of illustration. The material identification unit 110 may detect color data at an arbitrary coordinate in the visible image 400.

The material identification unit 110 may identify a type of a material imaged at each coordinate based on color data at each coordinate.

More specifically, the material identification unit 110 may identify the type of the material imaged at each coordinate with reference to reference color data stored in a memory. The reference color data may include information on a type of a material corresponding to detected color data.

The reference color data may be stored in a memory in a form of a color table corresponding to an arbitrary material or may be stored in a memory in a form of a color space corresponding to an arbitrary material.

Referring to FIG. 7, the memory stores therein a RGB color space expressed in a three-dimensional space based on magnitudes of R component, G component, and B component, and information about a material corresponding to an arbitrary position of the RGB color space.

The material identification unit 110 may identify, as C1 to C4, positions corresponding to color data RGB 1, RGB 2, RGB 3, and RGB 4 respectively detected at the coordinates (X1, Y1), (X2, Y2), (X3, Y3), and (X4, Y4) of the first to fourth measurement points as described above in the RGB color space, respectively.

In one example, materials corresponding to positions of the RGB color space, respectively as shown in [Table 1] below may be stored in a memory of the material identification unit 110.

TABLE 1

| [Positions] | [Materials] |
|---|---|
| C1 | M1 |
| C2 | M2 |
| C3 | M3 |
| C4 | M4 |

With reference to the memory, the material identification unit 110 may identify a material imaged at the coordinate (X1, Y1) of the first measurement point as M1, a material imaged at the coordinate (X2, Y2) of the second measurement point as M2, a material imaged at the coordinates (X3, Y3) of the third measurement point as M3, and a material imaged at the coordinates (X4, Y4) of the fourth measurement point as M4.

In one example, the image correction unit 120 may acquire a thermal image 500 of the circuit breaker 10.

The image correction unit 120 may receive the thermal image 500 from a thermal imaging camera (not shown) installed inside or outside the circuit breaker opening/closing assistance device 100 via data communication with the thermal imaging camera.

The thermal imaging camera may include any camera that detects heat generated by the circuit breaker 10. For example, the thermal imaging camera may include an infrared camera.

The thermal imaging camera may be installed outside the circuit breaker 10 to detect the heat generated from the outside of the circuit breaker 10, or may be installed inside the circuit breaker 10 to detect the heat generated by a component inside the circuit breaker 10.

The thermal imaging camera may generate the thermal image 500 using heat radiated from the circuit breaker 10. More specifically, the thermal imaging camera may express the circuit breaker 10 in different colors based on different intensities of heat radiated from different parts of the circuit breaker 10 to generate the thermal image 500.

Referring to FIG. 5, the circuit breaker 10 may be expressed in different colors based on a reference temperature range 520 of the thermal image 500. In this connection, the reference temperature range 520 may include temperature information based on a color rendered on the thermal image 500.

In one example, an imaging range of the thermal imaging camera may be included in an imaging range of the camera as aforementioned. That is, the imaging range of the camera may include an entirety of the imaging range of the thermal imaging camera.

Accordingly, any part of the circuit breaker 10 expressed on the thermal image 500 may be included in the visible image 400 as described above. In other words, a specific imaging region 510 expressed on the thermal image 500 in FIG. 5 may be included in the visible image 400 in FIG. 4 (410 in FIG. 4).

In one example, referring to, FIG. 4 and FIG. 5, the bus bar 11 is a conductor that supplies a large amount of current to the load 300. A temperature of the bus bar 11 may increase significantly as magnitude of current flowing via the load 300 increases.

In one example, the heat dissipating plate 12 adjacent to the bus bar 11 is a conductor having a large surface area, and may absorb the heat generated from the bus bar 11 to lower the temperature of the bus bar 11.

Accordingly, the temperature of the bus bar 11 may always be higher than the temperature of the heat dissipating plate 12.

However, when the emissivity of the material constituting the heat dissipating plate 12 is greater than the emissivity of the material constituting the bus bar 11, the temperature of the heat dissipating plate 12 may be expressed to be higher than the temperature of the bus bar 11 in a specific imaging region 510 of the thermal image 500 as shown in FIG. 5.

In order to prevent the inaccuracy in temperature detection, the image correction unit 120 may correct the thermal image 500 based on the emissivity of the material as identified by the material identification unit 110.

When the emissivity of the material identified by the material identification unit 110 is higher than a default emissivity preset in the image correction unit 120, the thermal image 500 may be corrected so that the temperature of the material in the thermal image 500 is detected to be lower.

Further, the emissivity of the material identified by the material identification unit 110 is lower than the default emissivity preset in the thermal imaging camera, the image correction unit 120 may correct the thermal image 500 so that the temperature of the material in the thermal image 500 is detected to be higher.

More specifically, the image correction unit 120 may correct the thermal image 500 in a corresponding manner to the coordinates of the visible image 400, based on the identified emissivity of the material.

As described above, the imaging range of the thermal image 500 may be included in the imaging range of the visible image 400. In this connection, a coordinate of the visible image 400 corresponding to a point on the circuit breaker 10 may be the same as that of the thermal image 500.

Referring to FIG. 6 and FIG. 8 together, the coordinates (X1, Y1), (X2, Y2), (X3, Y3), and (X4, Y4) of the first to fourth measurement points in the visible image 400 shown in FIG. 6 may be the same as the coordinates of the first to fourth measurement points in the thermal image 500 shown in FIG. 8.

That is, the visible image 400 and thermal image 500 may share the same coordinate system. The coordinate of one point on the circuit breaker 10 in the visible image 400 may be the same as the coordinate of one point on the circuit breaker 10 in the thermal image 500.

The image correction unit 120 may determine the emissivity of the material identified at each coordinate of the visible image 400 with reference to the memory, and may correct color data at each coordinate of the thermal image 500 based on the determined emissivity.

Each material and each emissivity of each material may be stored in the memory of the image correction unit 120 in A form of a look up table (LUT). For example, each emissivity corresponding to each material may be previously stored in the memory as shown in [Table 2] below.

TABLE 2

| [Material] | [Emissivity] |
|---|---|
| M1 | e1 |
| M2 | e2 |
| M3 | e3 |
| M4 | e4 |

The image correction unit 120 may determine the emissivity of the material identified at each coordinate of the visible image 400 with reference to the memory.

Accordingly, the image correction unit 120 may determine emissivity of a material (M1) identified at the coordinate (X1, Y1) of the first measurement point as e1, emissivity of a material (M2) identified at the coordinate (X2, Y2) of the second measurement point as e2, emissivity of a material (M3) identified at the coordinate (X3, Y3) of the third measurement point as e3, and emissivity of a material (M4) identified at the coordinate (X4, Y4) of the fourth measurement point as e4.

In one example, the material identification unit 110 may detect color change of the visible image 400 based on movement of the light source. The image correction unit 120 may determine the emissivity of the material based on the material imaged on the visible image 400 and the color change of the visible image 400.

As described above, the material identification unit 110 may control the light source. More specifically, the material identification unit 110 may control an angle of the light source or a position of the light source. The camera may generate the visible image 400 based on the movement of the light source.

The camera may provide the visible image 400 generated within a continuous time for which the light source moves to the material identification unit 110. The material identification unit 110 may identify the material imaged at each coordinate of the visible image 400 based on the visible image 400 initially provided from the camera.

Subsequently, the material identification unit 110 may receive a plurality of visible images 400 based on the movement of the light source from the camera, and may detect color change based on the movement of the light source at an arbitrary coordinate of the visible image 400.

The emissivity of the material may vary depending on a surface state of the material. More specifically, when the surface of the material is smoother, the emissivity thereof may be relatively higher. To the contrary, when the surface of the material is rougher, the emissivity thereof may be relatively lower.

In one example, when the surface of the material is smooth, reflectance of light generated from the light source from the material is relatively high. Thus, the emissivity of the material may be relatively higher. To the contrary, when the surface of the material is rough, the reflectance of light generated from the light source from the material is relatively low due to diffuse reflection. Thus, the emissivity thereof may be relatively lower.

Accordingly, the image correction unit 120 may determine the emissivity of the material based on the color change detected by the material identification unit 110.

More specifically, the image correction unit 120 may determine an emissivity range of the material imaged on the visible image 400 with reference to the memory, and may determine the emissivity included in the emissivity range based on the color change.

For example, emissivity of the material (M5) imaged at an arbitrary coordinate of the visible image 400 may be pre-stored in the memory as shown in [Table 3] below.

TABLE 3

| [Material] | [Emissivity] |
|---|---|
| M5 | e5 to e6 |

In this connection, the image correction unit 120 may determine the emissivity range of the material M5 as a range from e5 to e6 with referring to the memory.

In one example, the memory may pre-store maximum and minimum color changes of each of the materials therein. The image correction unit 120 may determine the emissivity of the material M5 based on the color change of the material M5 as determined in the range between the maximum color change and the minimum color change.

More specifically, the image correction unit 120 may detect the color change of the material M5, and may determine the emissivity of the material M5 based the detected color change and a ratio between the maximum color change and the minimum color change of the material M5.

For example, when the maximum color change and the minimum color change of the material M5 are R2 and R1, respectively, the color change of the material M5 as identified based on the visible image 400 may be R1+0.8×(R2−R1).

In this connection, the image correction unit 120 may determine the emissivity of the material M5 as e5+0.8×(e6−e5) in a proportional manner to the color change of the material M5 determined in the range between maximum color change and the minimum color change.

As described above, in accordance with the present disclosure, the emissivity of the material imaged on the visible image may be determined based on the color change of the visible image. Thus, in correcting the thermal image, the surface state of the material may be considered.

When the emissivity is determined, the image correction unit 120 may correct color data at each coordinate of the thermal image 500.

As shown in FIG. 8, the emissivity of the material imaged at each coordinate may be determined at each coordinate of the thermal image 500. In this connection, the image correction unit 120 may correct the color data at each coordinate of the thermal image 500 based on the determined emissivity at each coordinate.

The image correction unit 120 may provide an emissivity control signal to the thermal imaging camera, so that the thermal imaging camera changes the default emissivity set at each coordinate of the thermal image 500 to the emissivity determined based on each material.

Alternatively, the image correction unit 120 may not communicate with the thermal imaging camera and may change the color data at each coordinate of the thermal image 500 based on the determined emissivity of each material.

In addition, a method of correcting the thermal image 500 based on the emissivity may be performed based on various schemes used in the art.

For example, referring to FIG. 9, the thermal image 500 before the correction may include a person 530 and a concrete 540. In this connection, emissivity of the person 530 may be determined, for example, as 0.98, and the emissivity of the concrete 540 may be determined, for example, 0.8.

The image correction unit 120 may correct color data corresponding to each coordinate of the thermal image 500 based on the determined emissivity, thereby to generate a corrected thermal image 500'.

As described above, in accordance with the present disclosure, the thermal image of the circuit breaker may be corrected based on the emissivity of the material constituting the circuit breaker, such that the accuracy of temperature measurement based on the thermal image may be improved.

The diagnosis unit 130 may identify a normal operation state of the circuit breaker 10 based on a temperature value (hereinafter, detected temperature value) detected on the corrected thermal image 500', and may compare the identified normal operation state with a current operation state of the circuit breaker 10, and may diagnose absence or presence of failure of the circuit breaker 10 based on the comparison result.

In this connection, the normal operation state may mean a normal closed/opened state of the circuit breaker 10 within a temperature condition detected on the corrected thermal image 500'.

The temperature of the circuit breaker 10 may increase as current supplied to the load 300 increases within a temperature range in which the circuit breaker 10 does not block the current supplied to the load 300.

Hereinafter, a temperature value detected at a moment when the current supplied to the load 300 becomes overcurrent will be defined as a limit temperature. Further, a state in which the circuit breaker 10 allows supply of power from the power system 200 to the load 300 is defined as a closed state of the circuit breaker. A state in which the circuit breaker 10 disallows supply of power from the power system 200 to the load 300 is defined as an opened state of thereof.

For example, when the circuit breaker 10 is operating normally, and when the detected temperature value is below the limit temperature, the circuit breaker 10 may be controlled to be brought into the closed state. Conversely, when the detected temperature value is above or equal to the limit temperature, the circuit breaker 10 may be controlled to be brought into the opened state.

The normal operation state of the circuit breaker 10 based on the detected temperature value may be pre-stored in the memory. More specifically, the normal operation state of the circuit breaker 10 based on the temperature value detected at any measurement point of the circuit breaker 10 may be pre-stored in the memory.

The diagnosis unit 130 may identify the normal operation state of the breaker based on the detected temperature value with reference to the memory.

The limit temperature at any measurement point of the circuit breaker 10 when the overcurrent flows in the load 300 may be pre-stored in the memory.

The diagnosis unit 130 may identify the normal operation state of the circuit breaker 10 as the closed state when the detected temperature value is lower than the limit temperature. To the contrary, the diagnosis unit 130 may identify the normal operation state of the circuit breaker 10 as the opened state when the detected temperature value is above or equal to the limit temperature.

In other words, the diagnosis unit 130 may determine whether the overcurrent has occurred in the load 300, based on the detected temperature value at any measurement point of the circuit breaker 10 and thus may identify a normal closed/opened state of the circuit breaker 10 based on whether the overcurrent has occurred in the load 300.

The above-described detected temperature value may be a temperature value detected at an arbitrary point among temperature values detected on the thermal image 500'.

Alternatively, the detected temperature value may be a maximum temperature value among temperature values detected on the thermal image 500'.

Accordingly, the diagnosis unit 130 may identify the maximum temperature value among the temperature values detected on the thermal image 500', and may identify the normal operation state of the circuit breaker 10 based on the identified maximum temperature value.

The diagnosis unit 130 may compare the identified normal operation state with a current operation state of the circuit breaker 10 and may diagnose the absence or presence of failure of the circuit breaker 10, based on the comparison result.

In this connection, the current operation state of the circuit breaker 10 may mean a current closed/opened state of the circuit breaker 10.

The diagnosis unit 130 may receive information on an operating state of the circuit breaker 10 from the circuit breaker 10, and may identify the current operation state of the circuit breaker 10, based on the received operation state information.

The diagnosis unit 130 may diagnose the absence or presence of failure of the circuit breaker 10 based on whether the normal operation state matches the current operation state of the circuit breaker 10.

As described above, since both the normal operation state and the current operation state refer to the closed/opened state of the circuit breaker 10, each of the normal operation state and the current operation state may be the opened state or the closed state.

The diagnosis unit 130 may determine whether the normal closed/opened state of the circuit breaker 10 as identified based on the detected temperature value is identical with the current closed/opened state of the circuit breaker 10, and may diagnose the absence or presence of failure of the circuit breaker 10, based on the determination result.

For example, when the detected temperature value is lower than the limit temperature, the diagnosis unit 130 may determine that overcurrent does not flow in the load 300 and thus may determine the normal operation state of the circuit breaker 10 as the closed state. In this connection, the current closed/opened state of the circuit breaker 10 operating normally may be a closed state, while the current closed/opened state of the circuit breaker 10 in which failure occurs may be an opened state.

Conversely, when the detected temperature value is above or equal to the limit temperature, the diagnosis unit 130 may determine that overcurrent flows in the load 300, and thus may determine the normal operation state of the circuit breaker 10 as an opened state. In this connection, the current closed/opened state of the circuit breaker 10 operating normally may be an opened state, while the current closed/opened state of the circuit breaker 10 where failure has occurred may be a closed state.

Accordingly, the diagnosis unit 130 may diagnose a state of the circuit breaker 10 as a normal state when the normal operation state and the current operation state are identical with each other. When the normal operation state and the current operation state are not identical with each other, the diagnosis unit 130 may diagnose a state of the circuit breaker 10 as a failure state.

As described above, according to the present disclosure, comparing the normal closed/opened state of the circuit breaker as identified based on the thermal image of the circuit breaker with the current closed/opened state thereof may allow grasping the absence or presence of failure of the circuit breaker.

The controller 140 may receive information on the absence or presence of failure of the circuit breaker 10 from the diagnosis unit 130 as described above, and may create a control signal based on the absence or presence of failure of the circuit breaker 10 and may transmit the control signal to the circuit breaker 10. In this connection, the control signal may be a signal that controls the opening and closing of the circuit breaker 10.

The controller 140 may generate the control signal when the circuit breaker 10 is diagnosed as a failure state, and may provide the generated control signal to the circuit breaker 10. In other words, the controller 140 may not generate the control signal when the circuit breaker 10 is diagnosed as a normal state. Thus, the control signal may be generated only when the circuit breaker 10 is diagnosed as a failure state.

When the control signal is provided to the circuit breaker 10, the circuit breaker 10 may perform an opening/closing operation based on the control signal.

The control signal may include an opening control signal and a closing control signal. In this connection, the opening control signal may be a signal that controls the current closed/opened state of the circuit breaker 10 to the opened state. The closing control signal may be a signal that controls the current closed/opened state of the circuit breaker 10 to the closed state.

The controller 140 may provide the opening control signal to the circuit breaker 10 when the normal operation state of the circuit breaker 10 is an opened state and the current operation state of the circuit breaker 10 is an closed state.

In contrast when the normal operation state of the circuit breaker 10 is a closed state and the current operation state of the circuit breaker 10 is an opened state, the controller 140 may provide the closing control signal to the circuit breaker 10.

As described above, according to the present disclosure, the opening/closing operation of the circuit breaker may be assisted based on the temperature detected on the thermal image of the circuit breaker, thereby to prevent overcurrent occurrence and power supply interruption due to malfunction of the circuit breaker.

That is, according to the present disclosure, when a signal for controlling the opening and closing is not properly applied to the relay in the circuit breaker (relay malfunction), the control signal may be created and may be provided to the circuit breaker, thereby to allow the circuit breaker to work normally.

Next, with reference to FIG. 10 to FIG. 15, a circuit breaker opening/closing assistance device according to another embodiment of the present disclosure will be described in detail.

FIG. 10 is a diagram showing a circuit breaker opening/closing assistance device according to another embodiment of the present disclosure. FIG. 11 is a diagram illustrating a manner in which the circuit breaker opening/closing assistance device according to another embodiment of the present disclosure controls the circuit breaker connected to and disposed between a power system and a load FIG. 12 is a diagram showing a thermal image obtained by imaging a plurality of measurement points set in the circuit breaker. FIG. 13 is a view illustrating a manner in which a temperature reference value of the thermal image shown in FIG. 12 is adjusted based on a compensation value.

FIG. 14 and FIG. 15 are graphs respectively showing a temperature value of the thermal image and a control signal generated based on the temperature value.

Referring to FIG. 10, a circuit breaker opening/closing assistance device 100' according to another embodiment of the present disclosure may include a compensation unit 110', a diagnosis unit 120', and a controller 130'. The circuit breaker opening/closing assistance device 100' shown in FIG. 10 is an example. The components therein are not limited to the embodiment shown in FIG. 10. Some components may be added, changed, or deleted as necessary.

Each of the components constituting the circuit breaker opening/closing assistance device 110' may include a processor and a memory and may perform each function as described below via operation of the processor using the memory. Alternatively, the components may perform the functions as described below using one main processor.

Referring to FIG. 11, the circuit breaker opening/closing assistance device 100' may be connected to the circuit breaker 10 disposed between a power system 200 and a load 300. The circuit breaker 10 has been described with reference to FIG. 1 to FIG. 9, and, thus, detailed descriptions thereof will be omitted herein.

Referring back to FIG. 11, the compensation unit 110' may detect a first temperature based on the thermal image 500 of the circuit breaker 10.

The compensation unit 110' may receive the thermal image 500 from a thermal imaging camera (not shown) installed inside or outside the circuit breaker opening/closing assistance device 100' via data communication with the thermal imaging camera.

The thermal imaging camera may include any camera that detects the heat generated from the circuit breaker 10. For example, the thermal imaging camera may include an infrared camera.

The thermal imaging camera may be installed outside the circuit breaker 10 to detect the heat generated from an outer face of the circuit breaker 10, or may be installed inside the circuit breaker 10 to detect the heat generated from a circuit in the circuit breaker 10.

A position of the thermal imaging camera is not limited thereto and may vary based on a position of a measurement point to be described later.

The thermal imaging camera may generate the thermal image 500 using heat radiated from the circuit breaker 10. More specifically, the thermal imaging camera may express the circuit breaker 10 in different colors based on intensities of heats radiated from parts of the circuit breaker 10 to generate the thermal image 500.

Referring to FIG. 12, the circuit breaker 10 expressed on the thermal image 500 may be expressed in different colors based on a reference temperature range of the thermal image 500. The reference temperature range may be set as a range between a maximum temperature reference value 550 and a minimum temperature reference value 560.

When a temperature at one position of the circuit breaker 10 is the maximum temperature reference value 550, the position may be expressed in white on the thermal image 500. When a temperature at another position of the circuit breaker 10 is the minimum temperature reference value 560, the position may be expressed in black on the thermal image 500.

The correction unit may receive the thermal image 500 from the thermal imaging camera, and may detect a first temperature of the circuit breaker 10 based on a color rendered on the thermal image 500.

More specifically, the correction unit may refer to a color of each part of the circuit breaker 10 expressed on the thermal image 500 and a color defined in the reference temperature range of the thermal image 500 to detect the first temperature of each part of the circuit breaker 10.

In one example, at least one measurement point may be preset on the circuit breaker 10. In this connection, the measurement point may mean a position at which a temperature is measured. For example, the measurement point may include a specific position included in an internal circuit of the circuit breaker 10, a contact position of the circuit breaker 10, a position of the bus bar, and an arbitrary position on an outer case of the circuit breaker 10.

The compensation unit 110' may detect a coordinate of the measurement point on the thermal image 500, and may detect the first temperature corresponding to the detected coordinate.

Each point on the thermal image 500 may have a coordinate defined by a horizontal axis X and a vertical axis Y on the thermal image 500.

As shown in FIG. 12, a plurality of measurement points, for example, first to fourth measurement points A1 to A4 may be preset on the circuit breaker 10. The compensation unit 110' may detect a coordinate of a measurement point on the circuit breaker 10 on the thermal image 500.

For example, the compensation unit 110' may detect the coordinates of the first to fourth measurement points A1 to A4 as (U1, V1), (U2, V2), (U3, V3), and (U4, V4).

The compensation unit 110' may detect the first temperature corresponding to the detected coordinate at each measurement point.

More specifically, the compensation unit 110' may compare a color of the (U1, V1) coordinate with the reference temperature range to determine a temperature corresponding to the (U1, V1) coordinate, and may detect the determined temperature as the first temperature at the first measurement point (A1). In this way, the compensation unit 110' may compare colors of the (U2, V2), (U3, V3), and (U4, V4) coordinates with the reference temperature range to determine temperatures corresponding to the coordinates, and may detect each of the determined temperatures as the first temperature of each of the second to fourth measurement points A2 to A4.

The compensation unit 110' may compensate for a temperature value of the thermal image 500 using the first temperature detected in the above manner and a second temperature provided from a plurality of temperature sensors.

The plurality of temperature sensors may be installed on the circuit breaker 10. Each temperature sensor may be an analog temperature sensor, such as a thermistor or may be a digital temperature sensor.

The plurality of temperature sensors may be installed at any positions on the circuit breaker 10 to measure the second temperature as a temperature of each of the installation positions. For example, the plurality of temperature sensors may be installed in a specific position included in an internal circuit of the circuit breaker 10, a contact position of the circuit breaker 10, a position of the bus bar, and a position on an outer casing of the circuit breaker 10. The second temperature at each position may be measured by each temperature sensor.

In one example, the plurality of temperature sensors may be respectively provided on at least one measurement point as described above to measure the second temperature of each measurement point.

In other words, the plurality of temperature sensors may be installed at the first to fourth measurement points A1 to A4 shown in FIG. 12, respectively. The plurality of temperature sensors may measure the second temperatures at the first to fourth measurement points A1 to A4, respectively.

The compensation unit 110' may receive the second temperature at each measurement point from each of the plurality of temperature sensors, and may compensate for the temperature value of the thermal image 500 using the first temperature and second temperature as above-described.

Each temperature sensor may be installed at each measurement point to directly measure the temperature of the measurement point. The thermal imaging camera may indirectly measure the temperature of each measurement point using infrared rays, etc. Thus, in terms of the accuracy of the temperature measurement, the second temperature measured by the temperature sensor may be higher than the first temperature detected based on the thermal image 500.

Accordingly, the compensation unit 110' may compensate for the temperature value of the thermal image 500 such that the first temperature follows the second temperature.

More specifically, the compensation unit 110' may determine a compensation value using the first temperature and the second temperature at each of the plurality of measurement points set on the circuit breaker 10, and may compensate for the temperature value of the thermal image 500 using the determined compensation value.

In this connection, the compensation value may be determined as an average value of difference values between the first temperatures and the second temperatures.

Referring back to FIG. 12, the compensation unit 110' may identify the first temperatures of the first to fourth measurement points A1 to A4 as T1, T2, T3, and T4, respectively, based on the thermal image 500. Further, the second temperatures of the first to fourth measurement points A1 to A4 provided from the plurality of temperature sensors may be T1', T2', T3', and T4', respectively.

In this connection, the compensation value Q may be calculated based on a following [Equation 1]:

$$Q=((T1'-T1)+(T2'-T2)+(T3'-T3)+(T4'-T4))/4 \qquad \text{[Equation 1]}$$

In other words, the compensation unit 110' may determine an average value of values obtained by subtracting the first temperatures from the second temperatures at the first to fourth measurement points A1 to A4.

When the compensation value is determined, the compensation unit 110' may add the compensation value to the temperature reference value of the thermal image 500 to compensate for the temperature value of the thermal image 500.

More specifically, the compensation unit 110' may add the compensation value to each of the maximum temperature reference value 550 and the minimum temperature reference value 560 of the thermal image 500 to change the reference temperature range of the thermal image 500.

Referring to FIG. 13, the maximum temperature reference value 550 and minimum temperature reference value 560 before the compensation by the compensation unit 110' may be 66 degrees C. and 58.7 degrees C., respectively. Accordingly, the reference temperature range may be set to a range from 58.7 to 66 degrees C.

The compensation unit 110' may add the compensation value (Q) to each of the existing maximum temperature reference value 550 and minimum temperature reference value 560, so that the maximum temperature reference value 550 may be changed to 66+Q degrees C. and the minimum temperature reference value 560 may be changed to 58.7+Q degrees C. Accordingly, the reference temperature range may be set to a range from 58.7+Q to 66+Q degrees C.

As the compensation unit 110' has compensated for the reference temperature range of the thermal image 500, the compensated temperature value of the thermal image 500 may be detected to be higher by Q degrees than the temperature value thereof before the compensation operation.

As described above, according to the present disclosure, the device may compensate for the temperature value detected on the thermal image of the circuit breaker to improve the accuracy of temperature measurement based on the thermal image.

Referring back to FIG. 11, the diagnosis unit 120' may identify a normal operation state of the circuit breaker 10 based on a temperature value (hereinafter, detected temperature value: $T_{CB}$) detected on the compensated thermal image 500.

In this connection, the normal operation state may mean a normal closed/opened state of the circuit breaker 10 within the temperature condition detected on the compensated thermal image 500.

Hereinafter, as described with reference to FIG. 1 to FIG. 9, a temperature value $T_{CB}$ detected at a moment when the current supplied to the load 300 becomes overcurrent is defined as a limit temperature $T_{max}$. Further, a state in which the circuit breaker 10 allows supply of power from the power system 200 to the load 300 is defined as a closed state thereof. A state in which the circuit breaker 10 disallows supply of power from the power system 200 to the load 300 is defined as an opened state.

The normal operation state of the circuit breaker 10 based on the detected temperature value $T_{CB}$ may be pre-stored in the memory. More specifically, the normal operation state of the circuit breaker 10 based on the temperature value detected at an arbitrary measurement point may be pre-stored in the memory.

The diagnosis unit 120' may identify the normal operation state of the circuit breaker 10 based on the detected temperature value $T_{CB}$ with reference to the memory.

The limit temperature $T_{max}$ at any measurement point when overcurrent flows in the load 300 may be pre-stored in the memory. The diagnosis unit 120' may compare the detected temperature value $T_{CB}$ with the limit temperature $T_{max}$ to identify the normal operation state of the circuit breaker 10.

Referring to FIG. 14, the detected temperature value $T_{CB}$ may gradually increase since a time point $t_1$ when the load 300 starts to operate and then may exceed the limit temperature $T_{max}$ at a specific time point $t_2$.

The diagnosis unit 120' may identify the normal operation state of the circuit breaker 10 as a closed state for a period from 0 to $t_2$ and may identify the normal operation state of the circuit breaker 10 as an opened state for a period after $t_2$.

In other words, the diagnosis unit 120' may determine whether overcurrent has occurred in the load 300, based on the detected temperature value $T_{CB}$ at any measurement point of the circuit breaker 10 and may identify the normal closed/opened state of the circuit breaker 10 based on whether the overcurrent has occurred.

In one example, the diagnosis unit 120' may identify the normal operation state based on change in the detected temperature value $T_{CB}$.

In this connection, the change in the detected temperature value $T_{CB}$ may mean an amount by which the detected temperature value $T_{CB}$ at any measurement point of the circuit breaker 10 changes for a unit time duration.

When the current flowing in the load 300 increases rapidly, the detected temperature value $T_{CB}$ may also increase sharply. In this connection, when the change in the detected temperature value $T_{CB}$ is greater than or equal to a preset maximum change, the diagnosis unit 120' may determine that overcurrent flows in the load 300 even when the detected temperature value $T_{CB}$ is lower than the limit temperature $T_{max}$.

A maximum change in the detected temperature value $T_{CB}$ at any measurement point may be pre-stored in the memory. The diagnosis unit 120' may compare the temperature change in the detected temperature value $T_{CB}$ and the maximum change with each other with reference to the memory and may identify a normal operation state of the circuit breaker based on the comparison result.

More specifically, when the temperature change in the detected temperature value $T_{CB}$ is smaller than the maximum change, the diagnosis unit 120' may identify the normal operation state of the circuit breaker 10 as a closed state. To the contrary, when the temperature change in the detected temperature value TCB exceeds the maximum change, the normal operation state of the circuit breaker 10 may be identified as an opened state.

The diagnosis unit 120' may compare the identified normal operation state with the current operation state of the circuit breaker 10 and diagnose the absence or presence of failure of the circuit breaker 10 based on the comparison result.

In this connection, the current operation state of the circuit breaker 10 may mean the current open/closed state of the circuit breaker 10.

The diagnosis unit 120' may receive information on the operating state of the circuit breaker 10 from the circuit breaker 10, and may identify the current operation state of the circuit breaker 10 based on the received operation state information.

The diagnosis unit 120' may diagnose the absence or presence of failure of the circuit breaker 10 based on whether the normal operation state matches the current operation state of the circuit breaker 10.

As described above, since both the normal operation state and the current operation state refer to the closed/opened state of the circuit breaker 10, each of the normal operation state and the current operation state may be an opened state or a closed state.

The diagnosis unit 120' may determine whether the normal closed/opened state of the circuit breaker 10 as identified based on the detected temperature value $T_{CB}$ and the current closed/opened state of the circuit breaker 10 are identical with each other and may diagnose absence or presence of failure of the breaker 10 based on the comparison result.

For example, when the detected temperature value $T_{CB}$ is lower than the limit temperature $T_{max}$, the diagnosis unit 120' may determine that overcurrent does not flow in the load 300 and may determine the normal operation state of the circuit breaker 10 as a closed state. In this connection, the current closed/opened state of the circuit breaker 10 operating normally may be a closed state, whereas the current closed/opened state of the circuit breaker 10 in which failure occurs may be an opened state.

Conversely, when the detected temperature value $T_{CB}$ is greater than or equal to the limit temperature $T_{max}$, the diagnosis unit 120' may determine that overcurrent flows in the load 300 and may determine the normal operation state of the circuit breaker 10 as an opened state. In this connection, the current closed/opened state of the circuit breaker 10 operating normally may be an opened state, but the current closed/opened state of the circuit breaker 10 where failure has occurred may be a closed state.

Accordingly, the diagnosis unit 120' may diagnose a state of the circuit breaker 10 as a normal state when the normal operation state and the current operation state are identical with each other. When the normal operation state and the current operation state are not identical with each other, the diagnosis unit 120' may diagnose a state of the circuit breaker 10 as a failure state.

The aforementioned detected temperature value $T_{CB}$ may be a temperature value detected at any point among temperature values detected on the thermal image 500.

Alternatively, the detected temperature value $T_{CB}$ may be a maximum temperature value among temperature values detected on the thermal image 500.

Accordingly, the diagnosis unit 120' may identify a maximum temperature value among the temperature values detected on the thermal image 500, and may identify the normal operation state of the circuit breaker 10 based on the identified maximum temperature value.

Referring back to FIG. 12, the points on the thermal image 500 may have different temperatures, and, accordingly, may be expressed in different colors. In this connection, the diagnosis unit 120' may identify a coordinate of a point having the maximum temperature on the thermal image 500, that is, a point expressed in a white color and may identify a maximum temperature value corresponding to the identified coordinate.

The diagnosis unit 120' may compare the identified maximum temperature value with the limit temperature $T_{max}$ and identify the normal operation state of the circuit breaker 10 based on the comparison result. The diagnosis unit 120' may compare the identified normal operation state with the current operation state of the circuit breaker 10 and may diagnose the absence or presence of failure of the circuit breaker 10 based on the comparison result.

A method of diagnosing the absence or presence of failure of the circuit breaker 10 is the same as described above, and thus detailed descriptions thereof will be omitted herein.

The diagnosis unit 120' may diagnose a state of the circuit breaker 10 as an opened failure state when the normal operation state is an opened state and the current operation state is a closed state. Conversely, when the normal operation state is a closed state and the current operation state is an opened state, the diagnosis unit 120' may diagnose a state of the circuit breaker 10 as a closed failure state.

In this connection, the opened failure state means a state in which the circuit breaker 10 should have been but has not been switched from a closed state to an opened state. The closed failure state may mean a state in which the circuit breaker 10 should have been but has not been switched from an opened state to a closed state For example, when the detected temperature value $T_{CB}$ exceeds the limit temperature $T_{max}$, the circuit breaker 10 should be controlled to be brought into the opened state. However, when the current closed/opened state of the circuit breaker 10 is a closed state, the diagnosis unit 120' may diagnose a state of the circuit breaker 10 as an opened failure state.

Further, when the detected temperature value $T_{CB}$ is below the limit temperature $T_{max}$, the circuit breaker 10 should be controlled to be brought into a closed state. However, when the current closed/opened state of the circuit breaker 10 is an opened state, the diagnosis unit 120' may diagnose the state of the circuit breaker 10 as the closed failure state.

In other words, according to the present disclosure, the device may compare the normal closed/opened state of the circuit breaker identified based on the thermal image of the circuit breaker with the current closed/opened state thereof and may grasp the absence or presence of failure of the circuit breaker, based on the comparison result.

Referring back to FIG. 11, the controller 130' may receive information on the absence or presence of failure of the circuit breaker 10 from the diagnosis unit 120' as described above, and may create a control signal Sc, based on the absence or presence of failure of the circuit breaker 10 and may provide the control signal Sc to the circuit breaker 10.

The control signal Sc is a signal that controls the opening and closing of the circuit breaker 10, and may be a digital signal or an analog pulse signal.

The controller 130' may generate the control signal Sc when the circuit breaker 10 is diagnosed as a failure state, and may provide the generated control signal Sc to the circuit breaker 10.

In other words, when the circuit breaker 10 is diagnosed as a normal state, the controller 130' does not generate the control signal Sc. The control signal Sc may be generated only when the circuit breaker 10 is diagnosed as a failure state.

When the control signal Sc is provided to the circuit breaker 10, the circuit breaker 10 may perform an opening/closing operation based on the control signal Sc.

The control signal Sc may include an opening control signal and a closing control signal. In this connection, the opening control signal may be a signal that controls the current closed/opened state of the circuit breaker 10 to the opened state. The closing control signal may be a signal that controls the current closed/opened state of the circuit breaker 10 to the closed state.

The controller 130' may generate the opening control signal when a state of the circuit breaker 10 is diagnosed as the opened failure state. When a state of the circuit breaker 10 is diagnosed as the closed failure state, the closing control signal may be generated and provided to the circuit breaker 10.

Referring to FIG. 14 and FIG. 15, as described above, the diagnosis unit 120' may identify the normal operation state of the circuit breaker 10 as a closed state for a period from 0 to $t_2$ and may identify the normal operation state of the circuit breaker 10 as an opened state for a period after $t_2$.

When a state of the circuit breaker 10 is diagnosed as a closed failure state for a period from 0 to $t_2$, the controller 130' may generate the closing control signal having a high pulse (magnitude 1). Further, when a state of the circuit breaker 10 is diagnosed as an opened failure state for a period after $t_2$, the controller 130' may generate the opening control signal having a low pulse (magnitude 0).

When the generated control signal Sc is provided to the circuit breaker 10, a state of the circuit breaker 10 may be controlled to the closed state based on the high pulse, and may be controlled to the opened state based on the low pulse.

As described above, according to the present disclosure, the device may assist the opening/closing operation of the circuit breaker based on the temperature detected on the thermal image of the circuit breaker, thereby to prevent overcurrent occurrence and power supply interruption due to malfunction of the circuit breaker.

The present disclosure as described above may be subjected to various substitutions, modifications, and changes by a person having ordinary knowledge in the technical field to which the present disclosure belongs, within a scope that does not depart from the technical idea of the present disclosure. Thus, the present disclosure is not limited to the accompanying drawings and the above-described embodiments.

What is claimed is:

1. A device for assisting opening and closing of a circuit breaker connected to and disposed between a power system and a load, the device comprising:
   a material identification unit configured to acquire a visible image of the circuit breaker using a light source, and identify a material imaged on the acquired visible image;
   an image correction unit configured to acquire a thermal image of the circuit breaker, and correct the thermal image based on emissivity of the identified material;
   a diagnosis unit configured to:
      identify a normal operation state of the circuit breaker based on a temperature value detected on the corrected thermal image; and
      compare the identified normal operation state with a current operation state of the circuit breaker and diagnose absence or presence of failure of the circuit breaker based on the comparison result; and
   a controller configured to generate a control signal based on the absence or presence of the failure of the circuit breaker, and provide the generated control signal to the circuit breaker.

2. The device of claim 1, wherein the material identification unit is configured to identify a material imaged at each coordinate of the visible image based on color data detected at each coordinate of the visible image.

3. The device of claim 1, wherein the material identification unit is configured to identify a material imaged at each coordinate of the visible image,
   wherein the image correction unit is configured to correct the thermal image corresponding to each coordinate of the visible image based on emissivity of the identified material.

4. The device of claim 1, wherein the image correction unit is configured to:
   determine the emissivity of the material identified at each coordinate of the visible image with reference to a memory; and
   correct color data at each coordinate of the thermal image based on the determined emissivity.

5. The device of claim 1, wherein the material identification unit is configured to detect color change in the visible image according to movement of the light source,
   wherein the image correction unit is configured to determine the emissivity of the material based on the material imaged on the visible image and the color change in the visible image.

6. The device of claim 5, wherein the image correction unit is configured to:
   determine an emissivity range of the material imaged on the visible image with reference to a memory; and
   determine the emissivity included in the emissivity range based on the color change.

7. The device of claim 1, wherein a coordinate in the visible image and a coordinate in the thermal image corresponding to one point of the circuit breaker are identical with each other.

8. The device of claim 1, wherein the diagnosis unit is configured to:
   identify a maximum temperature value among temperature values detected on the corrected thermal image; and
   identify the normal operation state of the circuit breaker based on the identified maximum temperature value.

9. The device of claim 1, wherein the diagnosis unit is configured to diagnose a state of the circuit breaker as a normal state when the normal operation state and the current operation state are identical with each other,
   wherein the diagnosis unit is configured to diagnose a state of the circuit breaker as a failure state when the normal operation state and the current operation state are not identical with each other.

10. The device of claim 1, wherein the controller is configured to generate the control signal when a state of the circuit breaker is diagnosed as a failure state, and to provide the generated control signal to the circuit breaker.

11. A device for assisting opening and closing of a circuit breaker having a plurality of temperature sensors disposed thereon, the device comprising:
    a compensation unit configured to compensate for a temperature value of a thermal image of the circuit breaker, based on a first temperature detected on the thermal image of the circuit breaker and a second temperature provided from each of the plurality of temperature sensors;
    a diagnosis unit configured to:
       identify a normal operation state of the circuit breaker based on a temperature value detected on the compensated thermal image; and
       compare the identified normal operation state with a current operation state of the circuit breaker and diagnose absence or presence of failure of the circuit breaker, based on the comparison result; and
    a controller configured to generate a control signal based on the absence or presence of the failure of the circuit breaker, and provide the generated control signal to the circuit breaker.

12. The device of claim 11, wherein at least one measurement point is preset on the circuit breaker,
    wherein the compensation unit is configured to:
    detect a coordinate corresponding to the measurement point on the thermal image; and
    detect the first temperature corresponding to the detected coordinate.

13. The device of claim 11, wherein the compensation unit is configured to:
    determine a compensation value based on the first temperature and the second temperature at each of a plurality of measurement points set on the circuit breaker; and compensate for a temperature value of the thermal image using the determined compensation value.

14. The device of claim 13, wherein the compensation unit is configured to:
   determine an average value of differences between the first temperatures and the second temperatures as the compensation value; and
   add the determined compensation value to a temperature reference value of the thermal image to compensate for a temperature value of the thermal image.

15. The device of claim 11, wherein the diagnosis unit is configured to identify the normal operation state based on change in a temperature value detected on the compensated thermal image.

16. The device of claim 11, wherein the diagnosis unit is configured to:
   identify a maximum temperature value among temperature values detected on the compensated thermal image; and
   identify the normal operation state of the circuit breaker based on the identified maximum temperature value.

17. The device of claim 11, wherein the diagnosis unit is configured to:
   diagnose a state of the circuit breaker as a normal state when the normal operation state and the current operation state are identical with each other; and
   diagnose a state of the circuit breaker as a failure state when the normal operation state and the current operation state are not identical with each other.

18. The device of claim 17, wherein the diagnosis unit is configured to:
   diagnose a state of the circuit breaker as an opened failure state when the normal operation state is an opened state and the current operation state is a closed state; and
   diagnose a state of the circuit breaker as a closed failure state when the normal operation state is closed state and the current operation state is an opened state.

19. The device of claim 11, wherein the controller is configured to generate the control signal when a state of the circuit breaker is diagnosed as a failure state, and to provide the generated control signal to the circuit breaker.

20. The device of claim 19, wherein when a state of the circuit breaker is diagnosed as an opened failure state, the controller is configured to generate an opening control signal and to provide the opening control signal to the circuit breaker,
   wherein when a state of the circuit breaker is diagnosed as a closed failure state, the controller is configured to generate a closing control signal and to provide the closing control signal to the circuit breaker.

* * * * *